United States Patent
Butzmann

(10) Patent No.: US 6,956,366 B2
(45) Date of Patent: Oct. 18, 2005

(54) ARRANGEMENT FOR DETERMINING THE POSITION OF A MOTION SENSOR ELEMENT INFLUENCING THE FORMATION OF A MAGNETIC FIELD OF A WORKING MAGNET ALONG ITS MOTION COORDINATE

(75) Inventor: Stefan Butzmann, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 255 days.

(21) Appl. No.: 10/379,321

(22) Filed: Mar. 4, 2003

(65) Prior Publication Data

US 2003/0222642 A1 Dec. 4, 2003

(30) Foreign Application Priority Data

Mar. 7, 2002 (DE) .......................................... 102 10 184

(51) Int. Cl.⁷ ................................................ G01B 7/30
(52) U.S. Cl. ............................ 324/207.21; 324/207.12; 324/207.25
(58) Field of Search ....................... 324/207.21, 207.25, 324/207.12, 207.13, 207.15, 207.16, 207.17; 338/32 R

(56) References Cited

U.S. PATENT DOCUMENTS 5,041,765 A * 8/1991 Urataki et al. ......... 324/207.24
6,144,197 A * 11/2000 Shimamura et al. ........ 324/166
6,433,545 B1 * 8/2002 Kunze et al. ................ 324/252

FOREIGN PATENT DOCUMENTS

EP 0607595 7/1994 ........... G01R/33/06

* cited by examiner

Primary Examiner—Jay Patidar
(74) Attorney, Agent, or Firm—Aaron Waxler

(57) ABSTRACT

An arrangement can determine the position of a motion sensor element influencing the formation of a magnetic field of a working magnet periodically along its motion co-ordinate. Such an arrangement includes a sensor arrangement, sensitive along a measuring direction aligned parallel to the motion co-ordinate of the motion sensor element.

Figure 1:
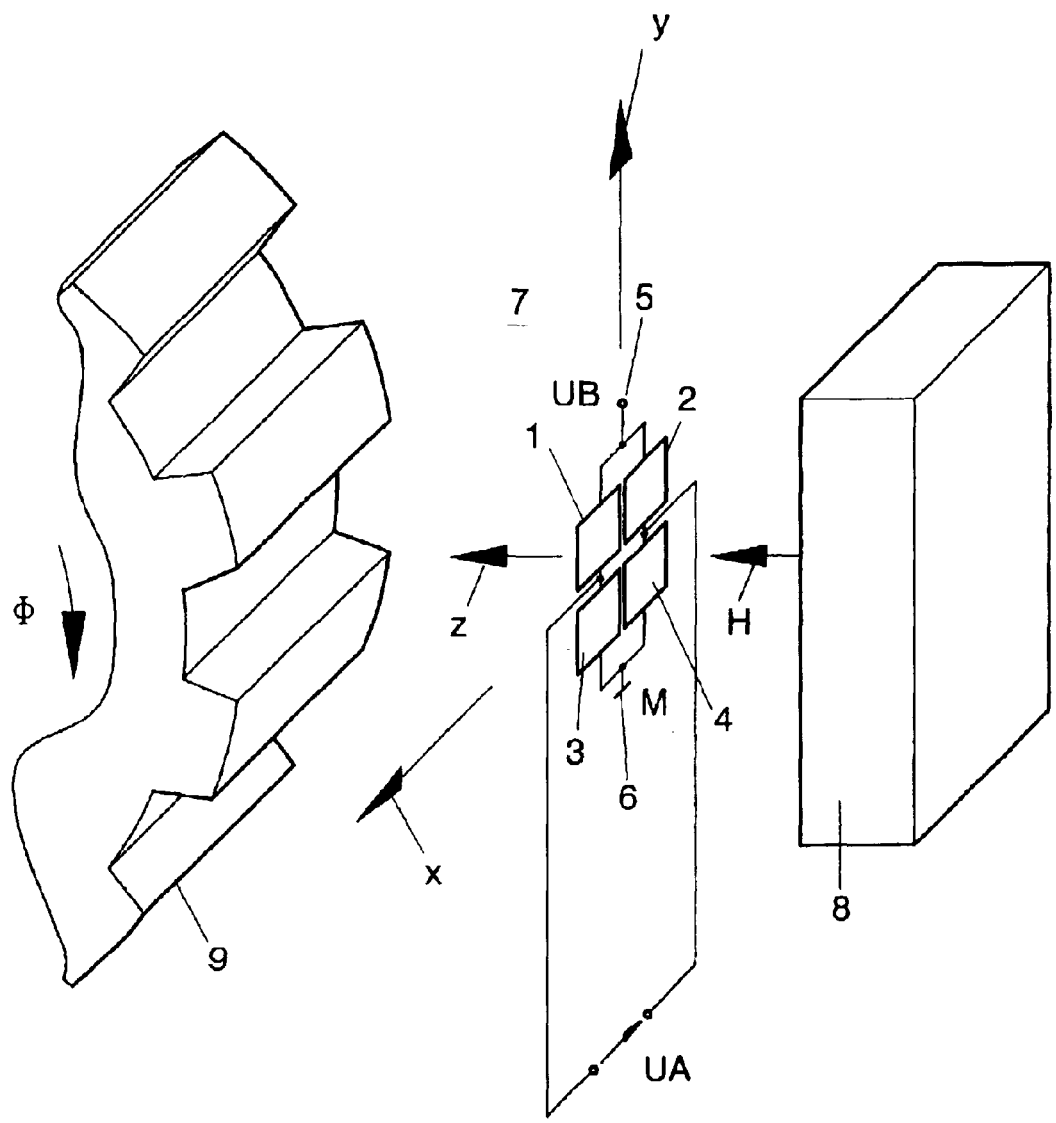

The motion sensor element includes; periodically recurrent areas alternately influencing the measuring field which is being formed parallel to the main surface.

The magnetic field of the working magnet is aligned perpendicular to the main surface of the motion sensor element.

The sensor arrangement is formed as a magnetoresistive sensor arrangement with at least one half bridge.

The arrangement according to the invention provides the possibility of a reliable operation, with a simple structure, also under said conditions and, in connection with a great freedom from interference, it is also quite insensitive to manufacturing tolerances.

8 Claims, 5 Drawing Sheets

ARRANGEMENT FOR DETERMINING THE POSITION OF A MOTION SENSOR ELEMENT INFLUENCING THE FORMATION OF A MAGNETIC FIELD OF A WORKING MAGNET ALONG ITS MOTION COORDINATE

The invention relates to an arrangement for determining the position of a motion sensor element influencing the formation of a magnetic field of a working magnet periodically along its motion co-ordinate, the arrangement comprising
a sensor arrangement, impressed with the magnetic field of the working magnet, which is sensitive along a measuring direction aligned at least substantially parallel to the motion co-ordinate of the motion sensor element to at least the polarity of the magnetic field of the working magnet impressed on the sensor arrangement and is adapted to supply a measuring signal in dependence upon a field component of the magnetic field of the working magnet impressed on the arrangement, denoted as measuring field and measured in the measuring direction,
wherein the motion sensor element, arranged in a strip-shaped zone of a main surface extending along the motion co-ordinate of the motion sensor element, comprises periodically recurrent areas alternately influencing the measuring field which is being formed parallel to the main surface and is at least substantially parallel to the motion co-ordinate of the motion sensor element, and the measuring direction of the sensor arrangement is aligned at least substantially parallel to the main surface of the motion sensor element,
wherein the magnetic field of the working magnet impressed on the sensor arrangement is aligned substantially perpendicular to the main surface of the motion sensor element with its main component determined by the principal direction of the magnetic field lines,
wherein the sensor arrangement is formed as a magnetoresistive sensor arrangement with at least one half bridge comprising at least two magnetoresistive sensor elements, which sensor elements are sensitive along the measuring direction to the magnetic field strength of the magnetic field of the working magnet and are adapted to supply the measuring signal in dependence upon the measuring field, at least two sensor elements in each half bridge having barberpole structures with mutually different alignments.

Arrangements for measuring the rotational speed of a rotating motion sensor element comprising a sensor arrangement utilizing the magnetoresistive effect have been described. This magnetoresistive sensor arrangement comprises four permalloy strips which are arranged on a silicon substrate in a meandering pattern and configured as a Wheatstone bridge. The magnetoresistive sensor arrangement is sensitive along a measuring direction to the polarity and the field strength of an external magnetic field and adapted to supply a measuring signal in dependence upon a field component of the magnetic field, denoted as measuring field and measured in the measuring direction.

Since, due to the magnetoresistive effect, a rotational movement of the motion sensor element cannot be directly measured, a permanent magnet denoted as working magnet is additionally fixed to the magnetoresistive sensor arrangement. This working magnet is stuck to the rear side of the magnetoresistive sensor arrangement or its housing so that the magnetoresistive sensor arrangement is permeated with the magnetic field of the working magnet, although in this assembly itself a field component of the magnetic field will not occur in the measuring direction without the motion sensor element. The measuring signal supplied by the magnetoresistive sensor arrangement is equal to zero in this configuration.

When a motion sensor element formed like a gear wheel of a ferromagnetic material is arranged in the vicinity of the sensor arrangement, this will lead to a change of the field variation of the magnetic field of the working magnet. To this end, the measuring direction of the magnetoresistive sensor arrangement is aligned in the direction of movement of the motion sensor element with respect to the teeth of the motion sensor element formed like a gear wheel of ferromagnetic material. The teeth of the motion sensor element thus move past the sensor arrangement in this measuring direction. Along the motion co-ordinate of the motion sensor element coinciding with the measuring direction, this leads to a distortion of the field lines of the magnetic field of the working magnet in the measuring direction of the sensor arrangement, which distortion occurs periodically with respect to the distance between the teeth of the gear wheel-like shape of the motion sensor element. In a "symmetrical" position, in which the sensor arrangement is centered in front of a tooth or in a gap between two teeth, the magnetic field is not distorted in the direction of movement of the motion sensor element, so that the output signal of the sensor arrangement is equal to zero in this position. In a "non-symmetrical" position, in which the sensor arrangement is neither centered in front of a tooth nor in front of a gap, the magnetic field is distorted in the direction of movement of the motion sensor element, which depends on the motion co-ordinate of the motion sensor element. The sensor arrangement thereby generates an output signal which is dependent on this motion co-ordinate of the motion sensor element, which output signal may be preferably at least substantially sinusoidal on the motion co-ordinate.

A magnetized motion sensor element has also been described by way of option, in which magnetic North and South poles of alternating polarity are arranged along its direction of movement. In this form, the motion sensor element itself provides the magnetic field and thereby also the measuring field.

Such magnetoresistive sensor arrangements are used together with rotating motion sensor elements in diversified systems for detecting the number of revolutions of wheels, shafts or the like, coupled to the motion sensor elements. One of the most principal fields of application is their use in anti-blocking systems or as crankshaft rotational sensors in motor vehicles. The sensor arrangement is then conventionally operated in front of a gear wheel of a magnetizable material, with four resistors connected in a Wheatstone bridge configuration as described in the opening paragraph, in which the measuring direction, i.e. the magnetically sensitive direction of the sensor arrangement is parallel to the rotational direction co-ordinate of the gear wheel in the manner described.

As described, the output signal of the Wheatstone bridge can be represented in a first approximation by a sinusoidal signal on the motion co-ordinate of the motion sensor element, in which the zero-crossings in the output signal occur before the center of a tooth or before the center of a gap between two teeth of the motion sensor element. In the case of a moved motion sensor element, the position of the motion sensor element with respect to the sensor element can be unambiguously determined from the output signal.

An example of such an arrangement for measuring the rotational speed of a rotating motion sensor element with a sensor arrangement of the type described in the opening paragraph is shown diagrammatically in FIG. 1. In this Figure, the magnetoresistive sensor arrangement comprises four sensor elements 1, 2, 3, 4 which, in the manner described, comprise permalloy strips arranged on a silicon substrate in a meandering pattern and configured as a Wheatstone bridge. This Wheatstone bridge is arranged between a first power supply terminal 5, to which a first power supply potential UB is applied in operation, and a second power supply terminal 6, to which a second power supply potential M, preferably ground potential, is applied in operation. In the example shown, the sensor arrangement is planar arranged in a plane subtended by the x co-ordinate axis and the y co-ordinate axis of a cartesian system of co-ordinates, to which plane a z co-ordinate axis is perpendicular. This magnetoresistive sensor arrangement is denoted in its entirety by the reference numeral 7.

Furthermore, a rectangular permanent magnet, referred to as working magnet 8, is mounted on the sensor arrangement 7. In a practical embodiment, this working magnet 8 is preferably stuck to the rear side of the sensor arrangement 7 or its housing so that the sensor arrangement 7 is permeated by the magnetic field H of the working magnet 8. The principal direction of the field lines of this magnetic field H extends along the z co-ordinate axis.

The magnetoresistive sensor arrangement 7 has a measuring direction along the y co-ordinate axis. Along this measuring direction, it is sensitive to the polarity and the field strength of an external magnetic field and is adapted to supply a measuring signal in dependence upon a field component of this magnetic field, denoted as measuring field and measured in the measuring direction. For operation, the external magnetic field is preferably and exclusively formed by the magnetic field H of the working magnet 8.

To measure the rotational speed of a rotating motion sensor element by means of the sensor arrangement 7 described hereinbefore, such a rotating motion sensor element 9 is positioned in front of the sensor arrangement 7 in the direction of the z co-ordinate axis. The motion sensor element 9 is formed from a ferromagnetic material in a gear wheel-shaped configuration and, in operation, rotates in the direction of a motion co-ordinate F. Along the motion co-ordinate F of the motion sensor element 9, this leads to a distortion of the field lines of the magnetic field H of the working magnet 8 in the measuring direction of the sensor arrangement 7, situated in the direction of the y co-ordinate axis, which distortion occurs periodically with respect to the distance between the teeth of the gear wheel-like shape of the motion sensor element 9. The field component of the magnetic field H of the measuring direction situated in the direction of the y co-ordinate axis is denoted as measuring field. In the sensor arrangement 7, the measuring field generates a preferably at least substantially sinusoidal output signal UA via the motion co-ordinate F, which signal is dependent on this motion co-ordinate F of the motion sensor element 9.

Figure 2:
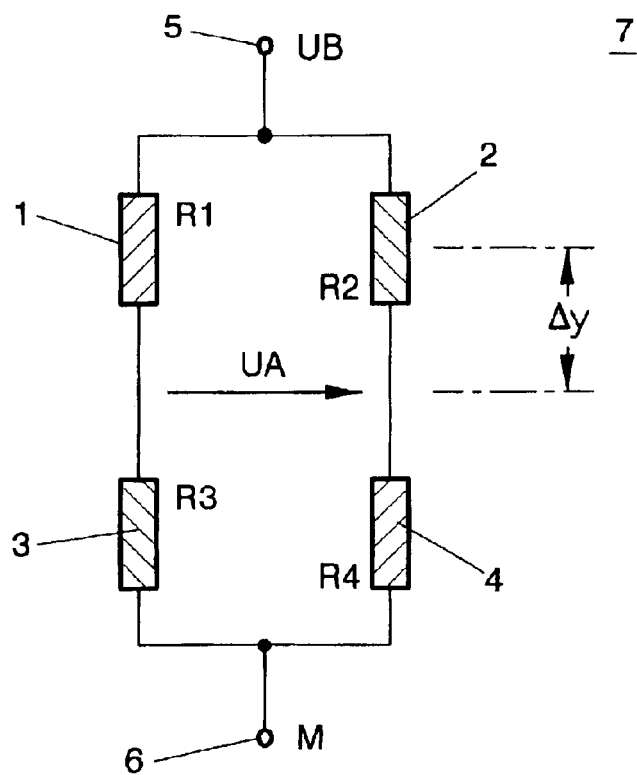

For further elucidation, FIG. 2 shows a circuit diagram of the sensor arrangement 7 of FIG. 1, in which corresponding elements are denoted by the same reference numerals. Different shaded areas of the individual sensor elements 1, 2, 3, 4 indicate that they are formed with barberpole structures, in which the alignments of the barberpole structures with respect to the directions of the electric currents flowing through the sensor elements 1, 2, 3 and 4, produced by the power supply potential UB, are indicated by the directions of the slanting lines. The choice of the barberpole structures of the sensor elements 1, 2, 3, 4 is made in such a way that the resistances R1 and R4 of the first and the fourth sensor element 1 and 4 are increased by the positive value of the magnetic field strength of the measuring field, and that the resistances R2 and R3 of the second and the third sensor element 2 and 3 are reduced by the positive value of the magnetic field strength of the magnetic field. To this end, the angle $a_i$ of the direction of the current through the sensor element i at a vanishing measuring field $H_i$ at the location of the sensor element i, with i=1, 2, 3, 4 is chosen to be as follows:

$$a_1=+45°, a_2=-45°, a_3=-45°, a_4=+45°.$$

Figure 3:
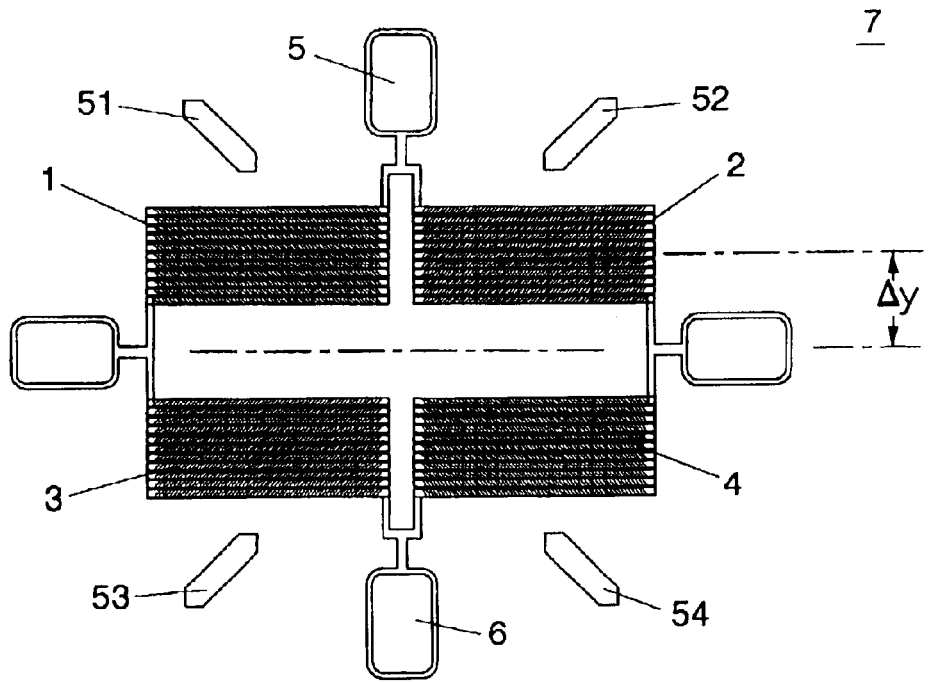

FIG. 3 shows a possible spatial form of the sensor arrangement 7, shown in FIG. 2, in a plan view on the plane subtended by the x co-ordinate axis and the y co-ordinate axis. The barberpole structures are shown diagrammatically and, for the sake of clarity, their alignments in the individual sensor elements 1, 2, 3, 4 are represented by symbols 51, 52, 53, 54 shown next to the individual sensor elements 1, 2, 3, 4, respectively.

For the measuring field at the location of the individual sensor elements i=1, 2, 3, 4, it holds in a first approximation:

$$H_i = H_{Offi} + H_{pk}\sin(nF - ny_i/r) + H_{ex}$$

Herein:

$H_i$ is the magnetic field strength of the measuring field at the sensor element i with the resistance $R_i$ $H_{Offi}$ is the offset part of the magnetic field strength of the measuring field at the sensor element i, caused, for example, by inhomogeneities of the measuring field along the measuring direction and being, for example, dependent on the distance between the motion sensor element 9 and the sensor arrangement 7 in the direction of the z co-ordinate axis, $H_{pk}$ is the amplitude of the magnetic field strength of the measuring field at the sensor element i n is the number of teeth on the motion sensor element 9 formed as a sensor wheel F is the motion co-ordinate of the motion sensor element 9 (for example, crankshaft angle of rotation)

r is the radius of the motion sensor element 9 formed as a sensor wheel $y_i$ is the co-ordinate of the sensor element i along the y co-ordinate axis (preferably the center of the spatial extension of the sensor element i along the y co-ordinate axis extending in the measuring direction)

$H_{ex}$ is the magnetic field strength of an external magnetic field superimposed throughout the plane of the sensor arrangement 7, particularly an interference field, at the sensor element i i is the index with i=1, 2, 3, 4

The following relation applies to the resistances Ri of the individual sensor elements i:

$$R_i = R_0 + \text{sign}(a_i) * S * H_i$$

$$\Leftrightarrow$$

$$R_i = R_0 + \text{sign}(a_i) * S * (H_{Offi} + H_{pk}*\sin(nF - ny_i/r) + H_{ex}),$$

i.e.

$Ri = R_0 + SH_i$ and $Ri = R = R_0 - SH_i$, respectively, wherein $R_0$ is the resistance of the individual sensor elements i at the working point, i.e. at a vanishing measuring field $H_i$, S is the resistance change of the resistances Ri in dependence upon the measuring field, i.e. the slope of the R–H characteristic curve of the sensor elements i or the sensitivity of the sensor elements i, Sign($a_i$) is the sign function whose value of +1 or −1 depends on the angle $\alpha_i$ of the direction of the current, and i is the index with i=1, 2, 3, 4.

and the sign before the second addend in these equations, i.e. the value of the sign function sign($a_i$), depends on the choice of the angle $\alpha_i$ of the direction of the current through the sensor element i at a vanishing measuring field $H_i$ at the location of the sensor element i, with i=1, 2, 3, 4, i.e. dependent on the choice of the alignment of the barberpole structures regarding the electric currents flowing through the sensor elements 1, 2, 3, 4.

For the resistances R1, R2, R3, R4 of the individual sensor elements 1, 2, 3, 4 of the sensor arrangement 7 of FIG. 2, the result is:

$$R1 = R_0 + S(H_{Off1} + H_{pk} \sin(nF-(ny_1/r)) + H_{ex})$$

$$R2 = R_0 - S(H_{Off2} + H_{pk} \sin(nF-(ny_2/r)) + H_{ex})$$

$$R3 = R_0 - S(H_{Off3} + H_{pk} \sin(nF-(ny_3/r)) + H_{ex})$$

$$R4 = R_0 + S(H_{Off4} + H_{pk} \sin(nF-(ny_4/r)) + H_{ex})$$

In accordance with FIG. 2, the relation $$y_1 = y_2 = -y_3 = -y_4 = \Delta y,$$

applies to the co-ordinates $y_1$, $y_2$, $y_3$ and $y_4$ of the sensor elements 1, 2, 3, 4 in the case of an assumed symmetrical construction of the sensor arrangement 7 regarding the x co-ordinate axis, wherein Dy denotes the value of the co-ordinate of the sensor elements 1, 2, 3, 4 of the magnetoresistive sensor arrangement 7. This means that the sensor elements 1, 2, 3, 4 have at least substantially corresponding co-ordinates in the direction of this y co-ordinate axis which is substantially parallel to the main surface of the motion sensor element 9 and to the measuring direction. Under the same assumption, it holds for the offset parts $H_{Off1}$ of the magnetic field strength of the measuring field:

$$H_{Off1} = H_{Off2} = -H_{Off3} = -H_{Off4} = H_{Off}$$

The output signal UA of the sensor arrangement 7 results in a first approximation in:

$$(UA/UB) = R3/(R1+R3) - R4/(R2+R4)$$
$$= -(SH_{pk}/R_0)\sin(nF)\cos(n\Delta y/r) - (SH_{ex}/R_0)$$

This equation shows that, on the one hand, the offset part of the magnetic field strength of the measuring field at the sensor elements 1, 2, 3, 4 does not have any influence on the output signal UA, but that an external field Hex in its full extent influences the output signal UA. In reality, there is an additional offset voltage $U_{Off}$ which results from the manufacturing tolerances of the four individual magnetoresistive sensor elements 1, 2, 3, 4 with the resistances R1 to R4. The above equation must thus be supplemented to:

$$(UA/UB) = (U_{Off}/UB) - (SH_{pk}/R_0)\sin(nF)\cos(n\Delta y/r) - (SH_{ex}/R_0)$$

When such a sensor arrangement is used in an ambience in which an external magnetic field $H_{ex}$ of the type described occurs, interferences in the measurement performed by the sensor arrangement are produced, because said field part $H_{ex}$ is superimposed as an interference field on the output signal UA. Such a case occurs, for example, when using a sensor as a crankshaft rotation sensor for motor vehicles in which particularly the starter currents may produce considerable external magnetic fields.

In such an ambience, the use of a sensor arrangement of the type described leads to unacceptable limitations of its operating capacity.

A possibility of generating an output signal which is independent of interference fields is provided by the gradient sensor which, however, generates an output signal with an offset.

In this respect, it is to be noted that a sensor chip is known from EP-A 0 607 595 which is particularly used for current and voltage measurement with a bridge circuit configured as a Wheatstone bridge for measuring gradients of the magnetic field strength and consists of four magnetoresistive resistors which are parallel arranged in two areas, at a distance from a central axis. Of these resistors, two series-arranged resistors constitute a branch of the Wheatstone bridge in which the two said areas comprise a magnetoresistive resistor of one bridge branch and a magnetoresistive resistor of the other bridge branch. The resistors of the two areas are arranged symmetrically with respect to the central axis. They consist of two coated strips which are mutually parallel and are parallel to the other strips, and are provided with barberpole structures. These barberpole structures are equal for all resistors, thus ensuring that only one applied field gradient controls the bridge. As the distance between the two areas, i.e. the basic length of the gradiometer is maintained small in this sensor chip, the influence of interfering magnetic fields, whose sources are at a larger distance from the measuring arrangement, is insignificant in accordance with the embodiments described in EP-A 0 607 595.

The output signal of the gradient sensor is obtained in a first approximation in accordance with the following equation:

$$(UA/UB) = (SH_{Off}/R_0) + (SH_{pk}/R_0)\cos(nF)\sin(n\Delta y/r)$$

It can be seen that by using such a gradient sensor, the influence of external magnetic fields and thus also external interference fields can be eliminated at least in a first approximation, but that the influence of the offset parts of the magnetic field strength of the measuring field remains on the sensor elements. These offset parts of the magnetic field strength of the measuring field on the sensor elements also prove to be dependent on the distance between the sensor arrangement and the motion sensor element 9 along the z co-ordinate axis. The resultant limitations of the output signal UA are not acceptable for a flawless operation of the sensor arrangement. Moreover, the output signal UA of the gradient sensor has a maximum when a tooth of the rotating motion sensor element formed as a sensor wheel (gear wheel) is centered in front of the sensor arrangement, and a minimum when an indentation (i.e. a gap) between two teeth of the rotating motion sensor element 9 formed as a sensor wheel (gear wheel) is centered in front of the sensor arrangement. An exact detection of these positions of the motion sensor element 9 along its motion co-ordinate F can therefore only be carried out with great difficulty.

German patent application 101 58 053.3 describes a sensor arrangement comprising at least two half bridges which are coupled together to form at least a Wheatstone bridge, which sensor arrangement comprises at least two magnetoresistive sensor elements in each half bridge, said sensor elements being sensitive along a measuring direction to the magnetic field strength of an applied magnetic field and being adapted to supply a measuring signal in dependence upon a field component of the magnetic field, denoted as measuring field and measured in the measuring direction, at least two of the sensor elements in each half bridge comprising barberpole structures having a mutually different alignment, and the co-ordinates of the sensor elements of at least one of the half bridges and the co-ordinates of the sensor elements of at least another one of the half bridges being chosen to be different to a predetermined extent along an axis of co-ordinates extending in the measuring direction. The co-ordinate of a sensor element describes the position of a spatial reference point at this sensor element along said axis of co-ordinates, preferably the location of a center of the spatial extension of the relevant sensor element in the direction of this axis of co-ordinates.

However, based on said manufacturing tolerances of the four individual magnetoresistive sensor elements 1, 2, 3, 4 with the resistances R1 to R4, the output signals of the sensor arrangements described hereinbefore are further beset with offsets in spite of the measures described, which offsets lead to the offset voltage $U_{Off}$ as mentioned hereinbefore. However, since the output signals of the proposed sensor arrangements have small amplitudes, this offset and the offset of input amplifiers of subsequent stages for amplifying and processing the output signals of the sensor arrangements have a very strong impact on the measuring accuracy of the sensor arrangements, i.e. the accuracy with which the value of the motion co-ordinate F of the motion sensor element describing the center of one of its teeth or the center of a gap coincides with a zero-crossing in the output signal of the sensor arrangement, i.e. a transition in the output signal of the sensor arrangement between a high and a low signal level.

It is an object of the invention to provide an arrangement for determining the position of a motion sensor element which is insensitive to the manufacturing tolerances described hereinbefore.

According to the invention, this object is solved by an arrangement for determining the position of a motion sensor element of the type described in the opening paragraph, which arrangement further comprises:

an arrangement for generating an additional magnetic field having a variable magnetic field strength, which additional magnetic field is aligned, at least substantially in the area of the extension of the sensor elements, substantially parallel to the magnetic field of the working magnet with its main component determined by the principal direction of its magnetic field lines, and for superimposing the magnetic field of the working magnet with said additional magnetic field so as to form a resultant magnetic field producing a resultant measuring field, an arrangement for temporally varying the magnetic field strength of the additional magnetic field for detecting values of the measuring signal in dependence upon these variations of the additional magnetic field and for storing these values of the measuring signal, and an evaluation unit for forming an output signal representing a measure of the motion co-ordinate of the motion sensor element by subtracting at least two consecutively detected values of the measuring signal.

With a simple structure, the arrangement according to the invention ensures a reliable operation, also under said complicated conditions, and, in connection with a great freedom from interference, it is also quite insensitive to manufacturing tolerances. Satisfactory measuring results can thereby also be obtained with sensor arrangements whose manufacture is not subject to strict tolerance requirements and which can therefore be manufactured at lower cost. In this way, the production costs of such arrangements for determining the position of a motion sensor element can be significantly reduced without affecting their quality. Particularly, the frequency at which the temporal variations of the magnetic field strength of the additional magnetic field occur are chosen to be clearly larger than the frequency at which the motion sensor element periodically influences the formation of the measuring field in operation of the arrangement according to the invention by varying its position along its motion co-ordinate.

In a further embodiment of the invention, the arrangement for generating the additional magnetic field advantageously comprises a coil arrangement which can be impressed with a temporally variable coil current. The desired additional magnetic field can thereby be generated in a simple, accurate and inexpensive manner.

A preferred further embodiment of the invention is characterized in that the coil arrangement at least substantially encloses the sensor elements along their spatial extension parallel to the main surface of the motion sensor element. This results in a satisfactory and possibly uniform effect of the additional magnetic field on the sensor arrangement.

In a further preferred embodiment of the invention, the coil arrangement is formed at least substantially planeparallel to the main surface of the motion sensor element. A very flat construction of the overall sensor arrangement, including the coil arrangement, can thereby be obtained, which has a favorable effect on the envisaged miniaturization of the arrangement according to the invention and on its mechanical robustness. A favorable formation of the variation of the magnetic field lines of the additional magnetic field can also be achieved in this way.

In accordance with a further embodiment of the invention, the coil arrangement and at least the sensor elements are arranged on a common substrate. As regards manufacturing costs, this is a particularly favorable solution for the mechanical compactness and robustness as well as for the reliability of its electrical operation.

In the arrangement according to the invention, the sensor arrangement is formed with two half bridges each comprising two bridge branches, each of which comprises at least one of the magnetoresistive sensor elements. These bridge branches preferably constitute a Wheatstone bridge which, in the way described hereinbefore, is provided with two power supply terminals for supplying a power supply voltage, and with two terminals for tapping the output signals of the sensor arrangement.

If, in a preferred embodiment of the invention as described hereinbefore, the arrangement for generating the additional magnetic field, formed, for example, as a coil arrangement, and at least the sensor elements are arranged, for example, on a common substrate and incorporated in this way, or in another constructive way having the same consequence, in a common housing, this common housing should be provided with a sufficient number of electric terminals so as to be able to electrically connect both the sensor arrangement and the arrangement for generating the additional magnetic field formed, for example, as a coil arrangement, to the other components of the arrangement according to the invention. When particularly the arrangement for generating the additional magnetic field is formed, for example, as a coil arrangement, this coil arrangement requires two further terminals. Even when one of these terminals is connected with one of the power supply terminals of the sensor arrangement, a housing designed for this purpose requires a larger number of electric terminals than a housing accommodating only the above-mentioned Wheatstone bridge. In a concrete case, a four-pole housing is available for accommodating the sensor arrangement, whereas a sensor arrangement according to the invention would require an at least five-pole housing, which would lead to a larger number of components and thus to higher costs.

In a further embodiment of the invention, the sensor arrangement is therefore formed with one half bridge comprising two bridge branches, each of which comprises at least one of the magnetoresistive sensor elements. Such a sensor arrangement only requires a single terminal for tapping the output signal. The described arrangement for generating the additional magnetic field formed, for example, as a coil arrangement, and at least the sensor elements can therefore be accommodated in a common, four-pole housing. Thus, an essentially simpler and cheaper structure of the overall arrangement can be obtained because it only requires four external terminals in this embodiment. Regardless of this, however, this embodiment of the invention, comprising a sensor arrangement with only one half bridge, has the same properties and advantages as the embodiment with a sensor arrangement comprising two half bridges, namely an output signal which is independent of the influence of external magnetic fields and of the influence of the offsets described above.

The arrangement according to the invention is preferably formed with a working magnet for generating the magnetic field of the working magnet. This working magnet may be particularly a permanent magnet. A simple and robust configuration is then obtained.

According to a further embodiment of the invention, the magnetic field of the working magnet comprises a magnetic field component which is aligned substantially parallel to the main surface of the motion sensor element and perpendicularly to the measuring direction. Instabilities of the characteristic curve of the sensor arrangement, referred to as "flipping" of the characteristic curve, are thereby avoided effectively.

In practice, it is advantageous in the described arrangements to superimpose an additional magnetic field component in the direction of at least a further axis of co-ordinates which is at least substantially orthogonal to the measuring direction on the magnetic field of the working magnet which, in the ideal case, has only a magnetic field component at the location of the sensor arrangement along the direction here denoted as the z co-ordinate axis and has a deflection in the measuring direction due to the positioning of the sensor arrangement in front of the motion sensor element. This direction is preferably constituted by the x co-ordinate axis in the arrangements shown. This additional magnetic field component, preferably in the direction of the x co-ordinate axis, is also denoted as supporting field of the sensor arrangement. In the case of a reversal of the direction (i.e. a reversed sign of the magnetic field strength) of this additional magnetic field component, it appears that the characteristic curve of the sensor arrangement, particularly the relationship between the measuring field and the motion co-ordinate of the motion sensor element and the output signal of the sensor arrangement, is inverted. Since such an inversion of the characteristic curve no longer ensures a correct evaluation of the output signal of the sensor arrangement, such a supporting field is advantageously provided.

Of course, the case may occur that the described supporting field within the spatial area covered by the sensor arrangement, i.e. along the x co-ordinate axis in the arrangements described, has divergencies, i.e. is inhomogeneous. Along this x co-ordinate axis, sensor elements of the sensor arrangement situated at different co-ordinates are also subjected to different field strengths of the supporting field, which leads to different sensitivities of these sensor elements regarding the measuring field.

In a further improvement of the invention, the sensor elements have at least substantially corresponding co-ordinates in the direction of at least a further co-ordinate axis which is substantially parallel to the main surface of the motion sensor element and at least substantially perpendicular to the measuring direction. Such an improvement may be advantageous both for the embodiment of the invention formed with two half bridges and for the one formed with only one half bridge. Particularly, the co-ordinate axis which is substantially parallel to the main surface of the motion sensor element and at least substantially perpendicular to the measuring direction is aligned at least substantially perpendicularly to the principal direction of the field lines of the applied magnetic field.

The sensitivities of the sensor elements of the different half bridges as regards the measuring field are thus matched so that the robustness of the sensor arrangement to external magnetic fields, and hence also to external interference fields, is significantly improved.

The sensor arrangement according to the invention thus ensures, in a simple manner, a reliable operation which is insensitive to all interference influences and supplies an output signal which can be evaluated accurately.

These and other aspects of the invention are apparent from and will be elucidated with reference to the embodiments described hereinafter.

Figure 4:
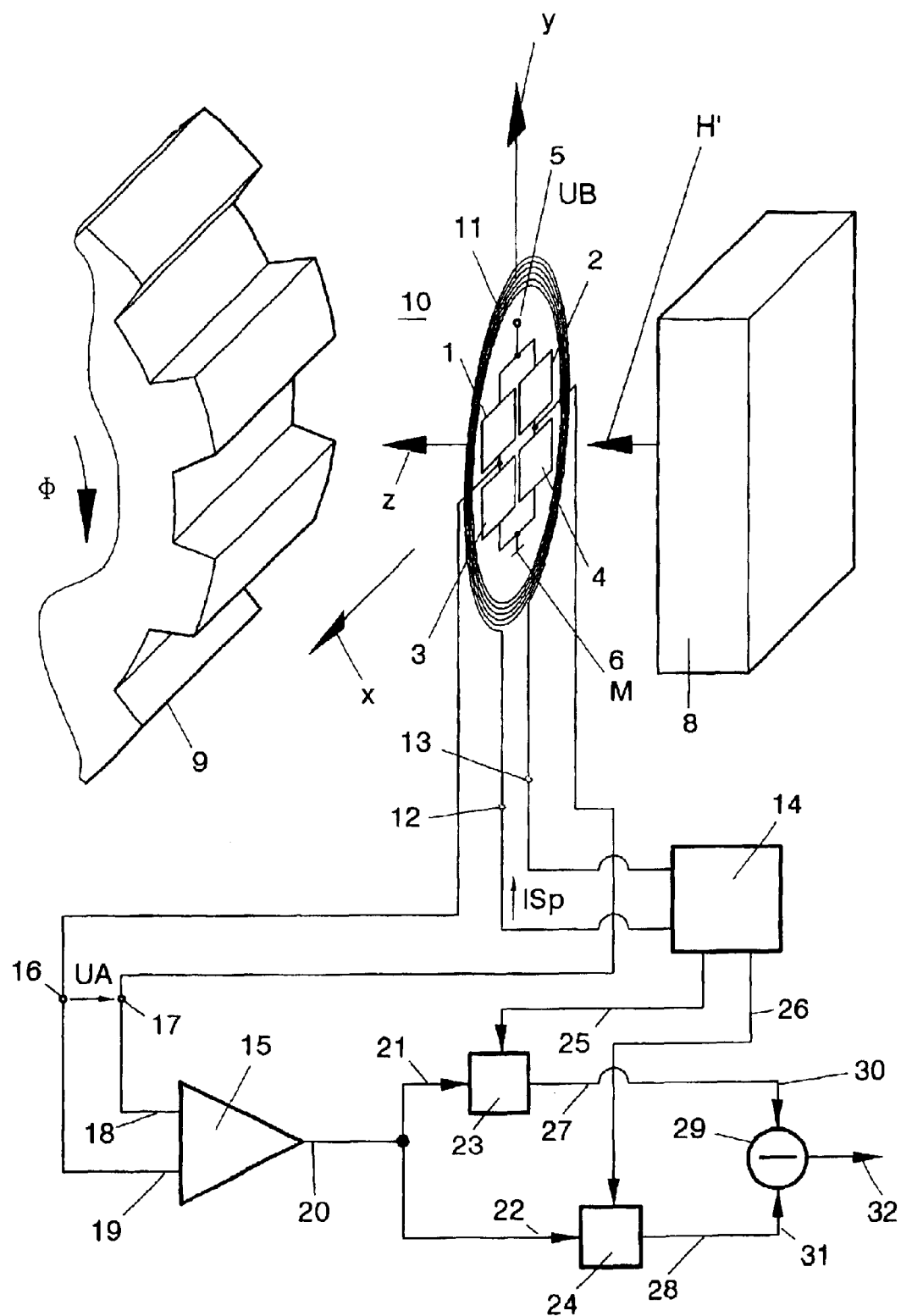
Figure 5:
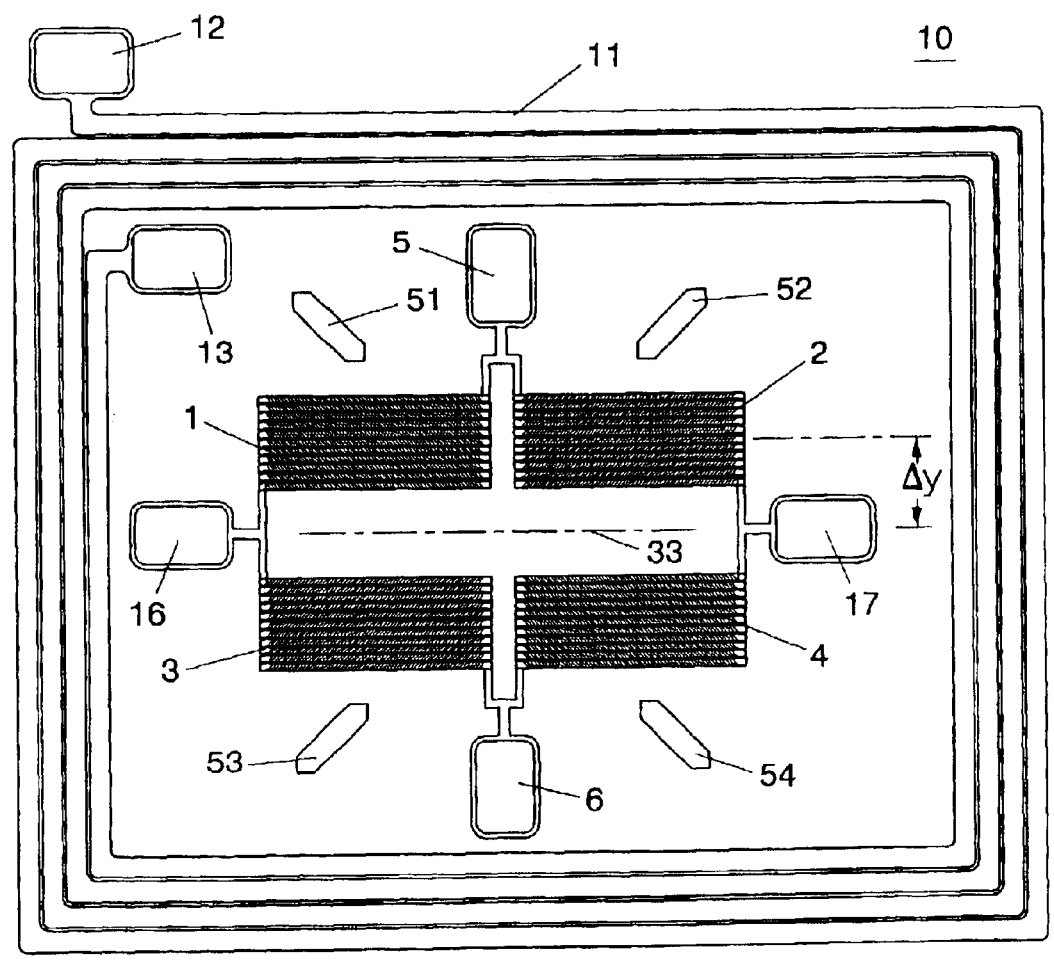
Figure 6:
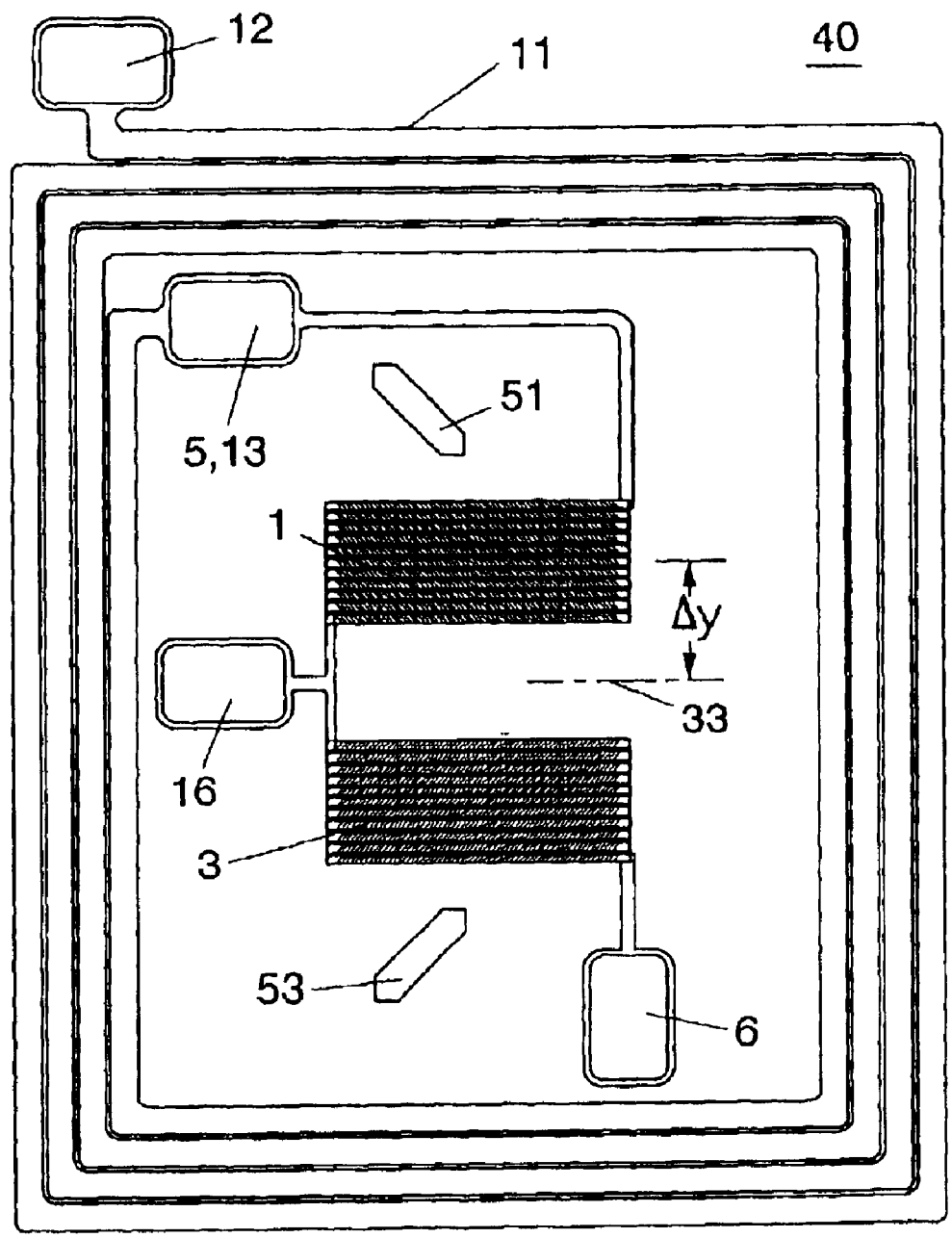

In the drawings:

FIG. 1 shows an example of an arrangement for measuring the rotational speed of a rotating motion sensor element, FIG. 2 is a circuit diagram of a sensor arrangement shown in FIG. 1, FIG. 3 is a possible spatial implementation of the sensor arrangement of FIG. 2, FIG. 4 is an embodiment of an arrangement according to the invention for measuring the rotational speed of a rotating motion sensor element, FIG. 5 is an example of a first spatial implementation of a sensor arrangement connected to a coil arrangement for the embodiment of the arrangement according to the invention as shown in FIG. 4, and FIG. 6 is an example of a second spatial implementation of a sensor arrangement connected to a coil arrangement for the embodiment of the arrangement according to the invention as shown in FIG. 4.

In addition to the elements already shown in FIG. 1 and explained with reference to this Figure, the embodiment of the arrangement according to the invention, shown in FIG. 4, for measuring the rotational speed of a rotating motion sensor element comprises a coil arrangement 11 which is used as an arrangement for generating an additional magnetic field and, in this example, is preferably formed plane-parallel to the plane subtended by the x and y co-ordinate axes. Together with the elements of a sensor arrangement 7 shown in FIG. 1, this coil arrangement 11 constitutes a configuration which is referred to as sensor arrangement connected to this coil arrangement 111 and is denoted by reference numeral 10. The coil arrangement 11 receives a coil current $I_{Sp}$ via terminals 12, 13, which coil current produces an additional magnetic field which, in the area of the extension of the sensor elements 1, 2, 3, 4, is aligned substantially parallel to the magnetic field H of the working magnet with its main component which is determined by the principal direction of its magnetic field lines. This additional magnetic field is superimposed in the area of the extension of the sensor elements 1, 2, 3, 4 additively with the magnetic field H of the working magnet so as to form a resultant magnetic field $H_1$ which produces a field component, referred to as resultant measuring field, in the measuring direction. In the resultant measuring field, the correspondingly aligned field components of the magnetic field H and the additional magnetic field are jointly modulated by the motion of the motion sensor element 9, here formed as a gear wheel, in front of the sensor arrangement 10. The field component of the additional magnetic field occurring in the direction of the field component of the magnetic field H, denoted as measuring field, has a magnetic field strength with the amplitude $H_{Sp}$. This amplitude $H_{Sp}$ of the magnetic field strength of the field component of the additional magnetic field produced by the coil arrangement 11 in the direction of the measuring field generated by the working magnet 8 is thus superimposed additively on the above-mentioned amplitude $H_{pk}$ of the magnetic field strength of the measuring field generated by the working magnet 8. This superposition results in the following amplitude, denoted by $H_{res}$, of the magnetic field strength of the resultant measuring field which replaces the above-mentioned amplitude $H_{pk}$ of the magnetic field strength of the measuring field generated by the working magnet 8:

$$H_{res}=H_{pk}+H_{Sp}$$

While taking this amplitude $H_{res}$ of the magnetic field strength of the resultant measuring field into account, it holds for the measuring field $H_{res\ i}$ at the location of the individual sensor elements i=1, 2, 3, 4 in a first approximation and in accordance with the formula for the arrangement shown in FIG. 1:

$$H_{res\ i}=H_{Off\ i}+H_{res}\sin(nF-(ny_i/r))+H_{ex}$$

$$\Leftrightarrow$$

$$H_{res\ i}=H_{Off\ i}+(H_{pk}+H_{Sp})\sin(nF-(ny_i/r))+H_{ex}$$

The physical quantities elucidated with reference to FIG. 1 then occur again.

For the resistances Ri of the individual sensor elements i, the following relation then holds:

$$Ri = R0 + \text{sign}(a_i) * S * Hres i$$

$$\Leftrightarrow$$

$$Ri = R0 + \text{sign}(a_i) * S * \left(H_{Off\ i} + (H_{pk} + H_{Sp}) * \sin\left(nf - \frac{ny_1}{r}\right) + H_{ex}\right),$$

i.e.

$$Ri=R_0+SH_{res\ i}\text{ and }Ri=R_0-SH_{res\ i},\text{ respectively.}$$

For the resistances Ri=R1, R2, R3 and R4 of the individual sensor elements i=1, 2, 3, 4 of the sensor arrangement 10 shown in FIG. 4, the result thus is:

$$R1=R_0+S(H_{Off1}+(H_{pk}+H_{Sp})\sin(nF-(ny_1/r))+H_{ex})$$

$$R2=R_0-S(H_{Off2}+(H_{pk}+H_{Sp})\sin(nF-(ny_2/r))+H_{ex})$$

$$R3=R_0-S(H_{Off3}+(H_{pk}+H_{Sp})\sin(nF-(ny_3/r))+H_{ex})$$

$$R4=R_0+S(H_{Off4}+(H_{pk}+H_{Sp})\sin(nF-(ny_4/r))+H_{ex})$$

resulting, in a first approximation and in accordance with one of the equations regarding FIG. 1, in:

$$(UA/UB)=(U_{Off}/UB)-(S(H_{pk}+H_{Sp})/R_0)\sin(nF)\cos(n\Delta y/r)-(SH_{ex}/R_0)$$

The amplitude $H_{Sp}$ of the magnetic field strength of the field component of the additional magnetic field, produced by the coil arrangement 11, in the direction of the measuring field generated by the working magnet 8, thus finds direct access to the output signal UA to be measured in the sensor arrangement 10. Temporal variations of this amplitude $H_{Sp}$ thus produce corresponding temporal variations of the output signal UA.

When, preferably, the frequency at which the temporal variations of the magnetic field strength of the additional magnetic field occur, i.e. the frequency of these temporal variations of the amplitude $H_{Sp}$ is chosen to be significantly larger than the frequency at which the motion sensor element 9 periodically influences the formation of the measuring field $H_{res\ i}$ during operation of the arrangement according to the invention, by variation of its position along its motion co-ordinate F, the part of the output signal UA which can be traced back to the motion of the motion sensor element 9 and will hereinafter be referred to as a useful signal, can be considered to be at least substantially constant throughout the temporal variations of the magnetic field strength of the additional magnetic field and hence the amplitude $H_{Sp}$. When particularly such a temporal variation of the amplitude $H_{Sp}$ is assumed at which the coil arrangement 11 alternately conveys a coil current $I_{Sp}$ different from zero or is currentless at consecutive instants, the result for a first one of these instants denoted as $t=t_{current}$ for the output signal UA of the sensor arrangement 10 is:

$$(UA/UB)(t_{current})=(U_{Off}/UB)-(S(H_{pk}+H_{Sp})/R_0)\sin(nF)\cos(n\Delta y/r)-(SH_{ex}/R_0)$$

whereas in the currentless state of the coil arrangement 11, it holds at a second one of these instants denoted as $t=t_0$, with $$I_{Sp}=0 \Leftrightarrow H_{Sp}=0$$

for the output signal UA of the sensor arrangement 10 that:

$$(UA/UB)(t_0)=(U_{Off}/UB)-(S(H_{pk}/R_0)\sin(nF)\cos(n\Delta y/r)-(SH_{ex}/R_0)$$

If, in accordance with the principle of a chopper amplifier, the difference DUA is formed from the measuring values of the output signals UA of two consecutive measurements at the first instant $t_{current}$ and at the second instant to, the result is:

$$(DUA/UB) = (UA/UB)(t_{current}) - (UA/UB)(t_0)$$

$$= (U_{Off}/UB) - (S(H_{pk} + H_{Sp})/R_0)\sin(nF)\cos(n\Delta y/r) -$$

$$(SH_{ex}/R_0) - \{(U_{Off}/UB) -$$

$$(SH_{pk}/R_0)\sin(nF)\cos(n\Delta y/r) - (SH_{ex}/R_0)\}$$

$$\Leftrightarrow$$

$$(DUA/UB) = -(SH_{Sp}/R_0)\sin(nF)\cos(n\Delta y/r)$$

This equation describes the position of the motion sensor element 9 along its motion co-ordinate F. It can be seen that the difference DUA gained from the measured values of two consecutive measurements of the output signal UA yields a signal which is independent of external interference fields and of offsets due to manufacturing tolerances. This difference DUA is also further independent of the amplitude $H_{pk}$ of the magnetic field strength of the measuring field, generated by the working magnet 8, at the sensor arrangement 10. Its amplitude may be easily adjusted by selecting the amplitude $H_{Sp}$ of the magnetic field strength of the field component, produced by the coil arrangement 11, of the additional magnetic field in the direction of the measuring field generated by the working magnet 8 and can thereby be adapted to the requirements imposed on the further signal processing of the measuring values.

The temporal variation of the coil current $I_{Sp}$ and hence the amplitude $H_{Sp}$ of the magnetic field strength of the field component, produced by the coil arrangement 11, of the additional magnetic field in the direction of the measuring field generated by the working magnet 8 may be performed in accordance with different signal shapes. As an example, sine signals or square-wave signals are shown which may also be optionally formed in a unipolar or bipolar way in accordance with an AC signal or a pulsed DC signal. As a modification of the above deduction for the expression for the difference DUA from the measuring values of two consecutive measurements of the output signal UA, this difference DUA may also be formed from two measuring values for which the instantaneous value of the coil current $I_{Sp}$ and hence the instantaneous value of the magnetic field strength of the field component, produced by the coil arrangement 11, of the additional magnetic field in the direction of the measuring field generated by the working magnet 8 is both times different from zero.

The reference numeral 14 in the embodiment shown in FIG. 4 denotes a control stage comprising an arrangement for temporally varying the magnetic field strength of the field component, produced by the coil arrangement 11, of the additional magnetic field in the direction of the measuring field generated by the working magnet 8. This arrangement supplies the coil current $I_{Sp}$ to the coil arrangement 11 and thereby controls the instantaneous value of said magnetic field strength. An arrangement for detecting values of the output signal UA constituting the measuring signal in dependence upon the described variations of the additional magnetic field in FIG. 4 comprises an amplifier stage 15 which receives the output signal UA at two input terminals 18, 19 from two taps 16 and 17 of the sensor arrangement 10 comprising the sensor elements 1, 2, 3, 4. An amplified output signal is supplied at the output terminal 20 of the amplifier stage 15 and applied to input terminals 21 and 22 of two sample-and-hold means 23 and 24 which are comprised in an arrangement for storing the detected values of the output signal UA which, in this case, constitutes the measuring signal. These sample-and-hold means 23 and 24 are controlled by the control stage 14 for storing two consecutively detected values of the output signal UA, for example, at the above-mentioned instants to and $t_{current}$ by way of storage command signals on control leads 25 and 26. The stored values $UA(t_0)$ and $UA(t_{current})$ of the output signal UA are then present at output terminals 27 and 28 of the sample-and-hold means 23 and 24, respectively, for the purpose of further signal processing.

For this further signal processing, the arrangement shown in FIG. 4 further comprises an evaluation unit for forming an output signal, representing a measure of the motion co-ordinate of the motion sensor element, by subtracting at least two consecutively detected values of the output signal UA constituting the measuring signal. In the embodiment shown in FIG. 4, this evaluation unit comprises a subtraction stage 29 receiving, at a first input terminal 30, a first one, for example $UA(t_0)$, of the stored values $UA(t_0)$ and $UA(t_{current})$ of the output signal UA and, at a second input terminal 31, a second one, for example $UA(t_{current})$, of the stored values $UA(t_0)$ and $UA(t_{current})$ of the output signal UA. In the subtraction stage 29, the difference DUA between these values $UA(t_0)$ and $UA(t_{current})$ is now formed in accordance with the above-mentioned equation and supplied, via an output 32, as an output signal representing a measure of the motion co-ordinate F of the motion sensor element 9.

The embodiment of the arrangement according to the invention, described hereinbefore with reference to FIG. 4, comprises a sensor arrangement 10 using a standard full bridge as is used in known sensor arrangements, i.e. an arrangement of sensor elements 1, 2, 3, 4 in a Wheatstone bridge configuration. According to the invention, this sensor arrangement is additionally enclosed by a coil arrangement 11. By varying the coil current $I_{Sp}$ by means of the coil arrangement 11, a variation of the measuring field, also to be denoted as—local—working field, is achieved, which allows a separation from the useful field (the magnetic field required for the measurement) and the external magnetic interference field in the subsequent signal processing operation and, consequently, a high suppression of external interference fields. By high frequency variation of the coil current $I_{Sp}$, other interference values such as particularly manufacture-conditioned offsets can be eliminated simultaneously.

The coil arrangement 111 is preferably built up in an integrated form on the substrate on which also the sensor elements 1, 2, 3, 4 of the sensor arrangement 10 are arranged. However, it is alternatively possible to use a discrete form, for example by means of a lead frame within a housing accommodating the entire sensor arrangement 10.

FIG. 5 shows an example of a first spatial implementation of a sensor arrangement 10, connected to a coil arrangement 11, for the embodiment of the arrangement according to the invention, shown in FIG. 4. In this Figure, elements already elucidated and described particularly with reference to FIGS. 1, 2 and 3 are denoted by the same reference numerals. The reference numeral 33 denotes the spatial central axis of the magnetoresistive sensor arrangement 10, from which the co-ordinates $y_i$ of the sensor elements i along the y co-ordinate axis and their value Dy are computed. Sensor elements 1, 2, 3, 4 and coil arrangement 11 are jointly arranged planar on a substrate, preferably in one plane, in which the coil arrangement 11 encloses the sensor elements 1, 2, 3, 4 in this plane. Said plane is aligned preferably at least substantially parallel to the main surface of the motion sensor element 9 in an arrangement as shown in FIG. 4.

The sensor arrangement shown in FIG. 5 comprises six terminals, namely the first power supply terminal 5 (for the first power supply potential UB), the second power supply terminal 6 (for the ground potential M), the first tap 16 of the sensor arrangement 10, the second tap 17 of the sensor arrangement 10 and the first terminal 12 and the second terminal 13 of the coil arrangement 11. Even when, for example, the first power supply terminal 5 and the second terminal 13 of the coil arrangement 11 are interconnected (or when the second power supply terminal 6 is connected to the second terminal 13 of the coil arrangement 11), at least five terminals separated from each other remain for the overall sensor arrangement 10, which terminals must be passed to the exterior from a common housing. This may be a hindrance for the object of using a standard four-pole housing.

To be able to apply the invention also in currently used housings having at most four terminals, a further embodiment of the invention provides the possibility of using only one half bridge instead of a full bridge, which half bridge is surrounded by a coil arrangement. An embodiment of such a sensor arrangement 40 formed in such a way is shown in FIG. 6. For the bridge output signal $UA_{HB}$ of the half bridge from, for example, the resistances R1 and R3—as shown in FIG. 6—the result, analogous to the computations described above for the full bridge, is:

$(UA_{HB}/UB)=R_3/(R_1+R_3)$, and, in a first approximation, for the currentless state:

$(UA_{HB}/UB)(t_0)=(U_{Off\,HB}/UB)+\frac{1}{2}-(SH_{pk})/(2R_0)\sin(nF)\cos(n\Delta y/r)-(SH_{ex})/(2R_0)$ Herein, $U_{Off\,HB}$ is the manufacture-conditioned offset voltage of the half bridge.

At the instants $t_{current}$ at which current $I_{Sp}$ flows through the coils, it correspondingly holds that $(UA_{HB}/UB)(t_{current})=(U_{Off\,HB}/UB)+\frac{1}{2}-(SH_{res})/(2R_0)\sin(nF)\cos(n\Delta y/r)-(SH_{ex})/(2R_0)$ For the subtraction in analogy with (14) it follows that:

$(DUA_{HB}/UB)=-(SH_{Sp})/(2R_0)\sin(nF)\cos(n\,\Delta y/r)$, wherein
$DUA_{HB}$ is the difference formed from the measuring values of the output signal $UA_{HB}$ of two consecutive measurements at the first instant $t_{current}$ and at the second instant to in accordance with the principle of a chopper amplifier.

This result corresponds to that of the full bridge, but for a factor of 0.5. The invention can thus be advantageously applied directly on a half bridge.

In a construction of the arrangement according to the invention with AMR sensor elements, the working magnet 8 is required. Particularly, this working magnet 8 is formed and magnetized in such a way that the magnetic field generated by this working magnet has a magnetic field component which is aligned substantially parallel to the main surface of the motion sensor element and perpendicularly to the measuring direction. This means that this magnetic field component, which is also referred to as supporting field, is aligned in the direction of the x co-ordinate axis. This measure is used to avoid "flipping" of the sensor, i.e. an instability of its characteristic curve.

In a construction of the arrangement according to the invention with GMR sensor elements, this working magnet may be dispensed with.

| List of reference signs | |
|---|---|
| 1 | first sensor element of the magnetoresistive sensor arrangement 7 |
| 2 | second sensor element of the magnetoresistive sensor arrangement 7 |
| 3 | third sensor element of the magnetoresistive sensor arrangement 7 |
| 4 | fourth sensor element of the magnetoresistive sensor arrangement 7 |
| 5 | first power supply terminal (for first power supply potential UB) |
| 6 | second power supply terminal (for ground potential M) |
| 7 | magnetoresistive sensor arrangement |
| 8 | working magnet |
| 9 | rotating motion sensor element |
| 10 | sensor arrangement, connected to the coil arrangement 11, in accordance with a first embodiment of the invention: connection of a magnetoresistive sensor arrangement 7, as shown in FIG. 1, to a coil arrangement 11 |
| 11 | coil arrangement |
| 12 | first terminal of the coil arrangement 11 |
| 13 | second terminal of the coil arrangement 11 |
| 14 | control stage, comprising an arrangement for temporally varying the magnetic field strength of the field component, produced by the coil arrangement 11, of the additional magnetic field in the direction of the measuring field generated by the working magnet 8 |
| 15 | amplifier stage |
| 16 | first tap on the sensor arrangement 10 |
| 17 | second tap on the sensor arrangement 10 |
| 18 | first input terminal of the amplifier stage 15 |
| 19 | second input terminal of the amplifier stage 15 |
| 20 | output terminal of the amplifier stage 15 for amplified output signal |
| 21 | input terminal of the first sample-and-hold means 23 |
| 22 | input terminal of the second sample-and-hold means 24 |
| 23 | first sample-and-hold means |
| 24 | second sample-and-hold means |
| 25 | control lead for storage command signals from the control stage 14 to the first sample-and-hold means 23 for storing one of two consecutive detected values of the output signal UA, for example, at the instants $t_0$ and $t_{current}$ |
| 26 | control lead for storage command signals from the control stage 14 to the second sample-and-hold means 24 for storing one of two consecutive detected values of the output signal UA, for example, at the instants $t_0$ and $t_{current}$ |
| 27 | output terminal of the first sample-and-hold means 23 at which the stored values $UA(t_0)$ or $UA(t_{current})$ of the output signal UA are present for further signal processing |
| 28 | output terminal of the second sample-and-hold means 24 at which the stored values $UA(t_0)$ or $UA(t_{current})$ of the output signal UA are present for further signal processing |
| 29 | subtraction stage |
| 30 | first input terminal of the subtraction stage 29 for supplying a first one, for example $UA(t_0)$, of the stored values $UA(t_0)$ or $UA(t_{current})$ of the output signal UA |
| 31 | second input terminal of the subtraction stage 29 for applying a second one, for example, $UA(t_{current})$, of the stored values $UA(t_0)$ or $UA(t_{current})$ of the output signal UA |
| 32 | output of the subtraction stage 29 for supplying the output signal which represents a measure of the motion co-ordinate F of the motion sensor element 9 |
| 33 | spatial central axis of the magnetoresistive sensor arrangement 10 |
| 40 | magnetoresistive sensor arrangement connected to the coil arrangement 11 and formed as a half bridge of, for example, the resistances R1 and R3 in accordance with a second embodiment of the invention (FIG. 6) |
| 51 | symbol for the alignment of the barberpole structures in sensor element 1 |
| 52 | symbol for the alignment of the barberpole structures in sensor element 2 |
| 53 | symbol for the alignment of the barberpole structures in sensor element 3 |
| 54 | symbol for the alignment of the barberpole structures in sensor element 4 |
| H | magnetic field of the working magnet 8 |
| H' | magnetic field resulting from the additive superposition of the magnetic field H of the working magnet with the additional magnetic field |
| $H_i$ | magnetic field strength of the measuring field at the sensor element i with the resistance Ri |
| $H_{ex}$ | magnetic field strength of an external magnetic field superimposed throughout the plane of the sensor arrangement 7, particularly an interference field, at the sensor element i |
| $H_{Off\,i}$ | offset part of the magnetic field strength of the measuring field at the sensor element i |
| $H_{off}$ | amount of the offset part of the magnetic field strength of the measuring field at the sensor element i |
| $H_{pk}$ | amplitude of the magnetic field strength of the measuring field generated by the working magnet 8 at the sensor element i |
| $H_{res}$ | amplitude of the magnetic field strength of the resultant measuring field |
| $H_{res\,i}$ | amplitude of the magnetic field strength of the resultant measuring field at the sensor element i |
| $H_{Sp}$ | amplitude of the magnetic field strength of the field component, produced by the coil arrangement 11, of the additional magnetic field in the direction of the measuring field generated by the working magnet 8 |
| i | index with i = 1, 2, 3, 4 |
| $I_{Sp}$ | coil current in the coil arrangement 11 |
| M | second power supply potential (= ground potential) |
| n | number of teeth on the motion sensor element 9 formed as a sensor wheel |

-continued

List of reference signs

| | |
|---|---|
| r | radius of the motion sensor element 9 formed as a sensor wheel |
| $R_o$ | resistance of the individual sensor elements i at the working point |
| Ri | resistance of the sensor element with reference sign i |
| S | change of the resistances Ri in dependence on the measuring field, i.e. slope of the R-H characteristic curve of the sensor elements with the reference sign i or sensitivity of the sensor elements with the reference sign i |
| $sign(a_i)$ | sign function whose value +1 or −1 depends on the angle $\alpha_i$ of the current flow direction in the sensor element |
| t | time |
| $t_0$ | second instant at which the coil arrangement 11 is in a currentless state |
| $t_{current}$ | first instant at which the coil arrangement 11 conveys a coil current $I_{Sp}$ different from zero |
| UA | output signal of the sensor arrangement 7 |
| $UA_{HB}$ | bridge output signal of the sensor arrangement 40 |
| UB | first power supply potential |
| $U_{Off}$ | offset voltage (of the full bridge shown in FIG. 1, 2, 3, 4 or 5) resulting from the manufacturing tolerances of the individual magnetoresistive sensor elements i with the resistances Ri |
| $U_{off\ HB}$ | offset voltage (of the half bridge shown in FIG. 6) resulting from the manufacturing tolerances of the individual magnetoresistive sensor elements i with the resistances Ri |
| x | co-ordinate axis |
| y | co-ordinate axis |
| $y_i$ | co-ordinate of the sensor element i along the y co-ordinate axis |
| z | co-ordinate axis |
| $a_i$ | angle of the current flow direction in the sensor element i at a vanishing measuring field $H_i$ at the location of the sensor element with the reference sign i |
| DUA | difference formed from the measuring values of the output signal UA in two consecutive measurements at the first instant $t_{current}$ and at the second instant $t_0$ in accordance with the principle of a chopper amplifier |
| $DUA_{HB}$ | difference formed from the measuring values of the output signal $UA_{HB}$ of two consecutive measurements at the first instant $t_{current}$ and at the second instant $t_0$ in accordance with the principle of a chopper amplifier |
| Dy | value of the co-ordinates of the sensor elements 1, 2, 3, 4 of the magnetoresistive sensor arrangements 7, 10, 40 |
| F | motion co-ordinate of the rotating motion sensor element 9 (for example, crankshaft angle of rotation). |

What is claimed is:

1. An arrangement for determining the position of a motion sensor element influencing the formation of a magnetic field of a working magnet periodically along its motion co-ordinate, the arrangement comprising a sensor arrangement, impressed with the magnetic field of the working magnet, wherein said magnetic field is sensitive along a measuring direction aligned at least substantially parallel to the motion co-ordinate of the motion sensor element to at least the polarity of the magnetic field of the working magnet impressed on the sensor arrangement and is adapted to supply a measuring signal in dependence upon a field component of the magnetic field of the working magnet impressed on the arrangement, denoted as measuring field and measured in the measuring direction, wherein the motion sensor element, arranged in zone of a surface, said zone extending along the motion co-ordinate of the motion sensor element, comprises periodically recurrent areas alternately influencing the measuring field which is being formed parallel to the main surface and is at least substantially parallel to the motion co-ordinate of the motion sensor element, and the measuring direction of the sensor arrangement is aligned at least substantially parallel to the surface of the motion sensor element, wherein the magnetic field of the working magnet impressed on the sensor arrangement is aligned substantially perpendicular to the main surface of the motion sensor element with its main component determined by the principal direction of the magnetic field lines, wherein the sensor arrangement is formed as a magnetoresistive sensor arrangement with at least one half bridge comprising at least two magnetoresistive sensor elements, which sensor elements are sensitive along the measuring direction to the magnetic field strength of the magnetic field of the working magnet and are adapted to supply the measuring signal in dependence upon the measuring field, at least two sensor elements in each half bridge having barberpole structures with mutually different alignments, characterized by an arrangement for generating an additional magnetic field having a variable magnetic field strength, which additional magnetic field is aligned, at least substantially in the area of the extension of the sensor elements, substantially parallel to the magnetic field of the working magnet with its main component determined by the principal direction of its magnetic field lines, and for superimposing the magnetic field of the working magnet with said additional magnetic field so as to form a resultant magnetic field producing a resultant measuring field, an arrangement for temporally varying the magnetic field strength of the additional magnetic field for detecting values of the measuring signal in dependence upon these variations of the additional magnetic field and for storing these values of the measuring signal, and an evaluation unit for forming an output signal representing a measure of the motion co-ordinate of the motion sensor element by subtracting at least two consecutively detected values of the measuring signal.

2. An arrangement as claimed in claim 1, characterized in that the arrangement for generating the additional magnetic field comprises a coil arrangement which can be impressed with a temporally variable coil current.

3. An arrangement as claimed in claim 2, characterized in that the coil arrangement at least substantially encloses the sensor elements along their spatial extension parallel to the main surface of the motion sensor element.

4. An arrangement as claimed in claim 2, characterized in that the coil arrangement is formed at least substantially parallel to the main surface of the motion sensor element.

5. An arrangement as claimed in claim 2, characterized in that the coil arrangement and at least the sensor elements are arranged on a common substrate.

6. An arrangement as claimed in claim 1, characterized in that the sensor arrangement is formed with one half bridge comprising two bridge branches, each of which comprises at least one of the magnetoresistive sensor elements.

7. An arrangement as claimed in claim 1, characterized in that the sensor arrangement is formed with two half bridges each comprising two bridge branches, each of which comprises at least one of the magnetoresistive sensor elements.

8. An arrangement as claimed in claim 1, characterized in that the sensor elements have corresponding co-ordinates in the direction of at least a further co-ordinate axis which is substantially parallel to the main surface of the motion sensor element and at least substantially perpendicular to the measuring direction.

* * * * *